United States Patent [19]
Thornburg

[11] 3,987,311
[45] Oct. 19, 1976

[54] SHIFT REGISTER UTILIZING AMORPHOUS SEMICONDUCTOR THRESHOLD SWITCHES

[75] Inventor: David D. Thornburg, Los Altos, Calif.

[73] Assignee: Xerox Corporation, Stamford, Conn.

[22] Filed: Apr. 25, 1975

[21] Appl. No.: 572,487

[52] U.S. Cl. .............................. 307/221 R; 357/2; 357/28; 307/310
[51] Int. Cl.² ........................................ G11C 19/28
[58] Field of Search .......... 307/221 R, 310; 357/28, 357/2

[56] References Cited
UNITED STATES PATENTS

| | | | |
|---|---|---|---|
| 2,991,374 | 7/1961 | De Miranda et al. | 307/221 R |
| 3,020,410 | 2/1962 | Bowerman | 307/221 R |
| 3,469,154 | 9/1969 | Scholer | 357/28 X |
| 3,573,438 | 4/1971 | Rowen | 307/221 R |

*Primary Examiner*—John S. Heyman
*Attorney, Agent, or Firm*—J. E. Beck; T. J. Anderson; A. W. Karambelas

[57] ABSTRACT

A shift register that utilizes a plurality of amorphous semiconductor threshold switches. The shift register is driven by a two phase clock with odd-numbered threshold switches being supplied a pulse waveform of one phase and even-numbered threshold switches being supplied a pulse waveform of a different phase. The threshold switches have a V-I characteristic that is strongly temperature dependent and each is heated by a heating element which can take the form of an amorphous semiconductor current controlled negative differential resistance device, with the current controlled negative differential resistance devices and the threshold switches fabricated simultaneously on a common substrate.

6 Claims, 5 Drawing Figures

SHIFT REGISTER UTILIZING AMORPHOUS SEMICONDUCTOR THRESHOLD SWITCHES

BACKGROUND OF THE INVENTION

In U.S. Pat. No. 3,573,438, there is disclosed a controlled shift register comprising a plurality of parallel connected shift modules, with each module including a thermoresistive element characterized by a metal-semiconductor phase transition, that is, a transition temperature below which the thermoresistive material has semiconductor conduction characteristics and above which the thermoresistive material has metallic conduction characteristics. A heating resistor is connected in series with each thermoresistive element with each heating resistor being disposed adjacent to both the thermoresistive element in series therewith and the thermoresistive element of the next succeeding shift module. The heating resistors of alternate module are connected to oppositely poled control elements. When a shift module is triggered by applying an initial heat pulse to its associated thermoresistive element, the thermoresistive element switches to its low resistance state, and, in turn, allows substantial current to flow through its series connected heating resistor. Due to the adjacent disposition of the heating resistor with its associated thermoresistive element and the thermoresistive element of the next succeeding module, the current flow through the heating resistor continues the heating of its associated thermoresistive element when the initial triggering heat pulse is removed and also initiates heating of the thermoresistive element of the next succeeding shift module and switches it to its low resistance state. Heating of both thermoresistive elements continues until the control element in series with the thermoresistive element of the next succeeding shift module is phased to conduction at which time the heating element in series therewith continues the heating of its series-connected thermoresistive element and initiates heating of the thermoresistive element of the next succeeding module. In this manner, the initial trigger pulse is made to propagate from one shift module to the next shift module as the phase of the voltage across the control elements of the shift register changes.

The referenced shift register offers limited utilization because the thermoresistive element of any stage or module must be continuously heated if it is to be maintained in its low resistance state. As noted, this continuous heating is achieved by disposing each heating resistor adjacent to both the thermoresistive element of its module and the thermoresistive element of the next succeeding module. Thus, the referenced shift register cannot be used to control remote electrical elements, such as a remote line buffer. Also, continuous heating by the heating resistors may cause severe heat sinking problems.

OBJECTS OF THE INVENTION

It is an object of the present invention to provide an improved shift register.

It is a further object of the present invention to provide a shift register which is thermally responsive.

It is a further object of the present invention to provide an improved shift register having heat responsive threshold switches.

SUMMARY OF THE INVENTION

In accordance with the invention a shift register is provided that utilizes a linear array of heat-gated amorphous semiconductor threshold switches which have the property that their threshold voltage decreases as ambient temperature increases. A heating element is connected in series with each switch and also in proximity to the next succeeding threshold switch of the array, and the array is driven by a two-phase clock. Once a threshold switch is heated sufficiently to switch it to its low resistance state, it will remain in that state without further heating, provided that the holding current is maintained. This allows the shift register to provide control of remotely displaced circuit devices and to thus have wide utility. Also, the shift register reduces power consumption due to the fact that heat may be removed from any of the threshold switches after it has switched to its low resistance state.

In an embodiment of the invention the heating resistors are amorphous semiconductor current controlled negative differential resistance elements with the edge-to-edge distance between these heating elements and the gated threshold switches being small so as to maximize thermal coupling. With this embodiment, it is possible to produce a totally integrated shift register structure with limited photolithographic masking.

DESCRIPTION OF THE PREFERRED EMBODIMENT

Figure 1:
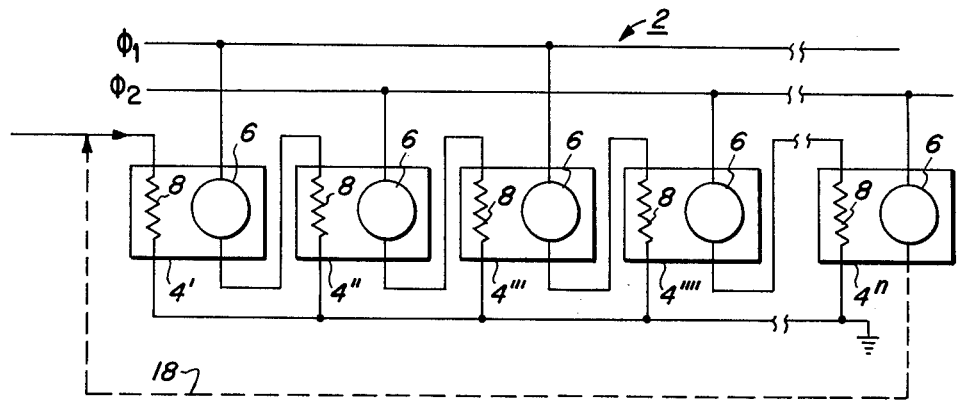
FIG. 1 is a schematic representation of a shift register in accordance with the invention.
Figure 2:
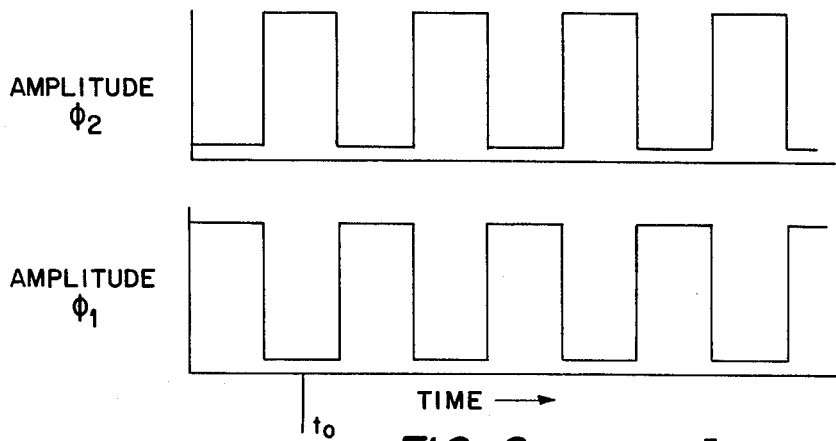
FIG. 2 depicts waveforms supplied to the shift register of FIG. 1.

Referring now to FIG. 1, there is shown a shift register 2 in accordance with the invention which utilizes an array of shift modules $4'$, $4''$, $4'''$, $4''''$ $4^n$, each comprised of a heat-gated threshold switch 6 and adjacent heating resistor 8. The shift register is driven by a two phase clock having phases $\phi_1, \phi_2$; with a terminal of the threshold switches 6 of the odd-number modules being supplied the $\phi_1$ clock signal and a terminal of the threshold switches 6 of the even-numbered modules being supplied the $\phi_2$ clock signal. The other terminal of each threshold switch 6 is connected to a terminal of the heating resistor 8 of the next succeeding module with each heating resistor having a terminal maintained at a reference potential. The waveforms of the $\phi_1$ and $\phi_2$ signals are shown in FIG. 2 with a 180° phase shift therebetween.

Figure 3:
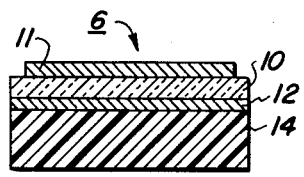
FIG. 3 is an elevation view of a threshold switch of the shift register of FIG. 1.

Each of the threshold switches 6 is comprised of a layer of an amorphous semiconductor material 10 sandwiched between metallic electrodes 11 and 12, with insulating layer 14 providing support for electrode 12, as shown in FIG. 3. The electrode 11 may be, for example, a thin (0.25 micron) layer of chromium or aluminum, and electrode 12 may be, for example, an aluminum or chromium layer 0.5 microns thick. The electrode 11 is connected to receive one of the phased clock signals and the electrode 12 is coupled to the heating resistor of the next succeeding shift register module. The amorphous semiconductor material 10 may consist of, but is not restricted to, the class of amorphous semiconductor materials known as chalcogenide glasses. Some examples of chalcogenide glasses which can be used in the device described within this preferred embodiment, are alloys consisting of, by atomic fraction, 40% arsenic, 60% tellurium; 40% arsenic, 40% selenium, 20% tellurium; 40% arsenic, 20% selenium, 40% tellurium; 48% tellurium, 30% arsenic, 12% silicon, 10% germanium; and numerous other alloys which could be chosen for their electrical properties and resistivity to crystallization. The amorphous semiconductor material 10 may be of any reasonable thickness and in this preferred embodiment would be on the order of 1 micron thick. Other amorphous semiconductor materials and electrode materials, and other material thickness, will be apparent to those skilled in the art.

Figure 3A:
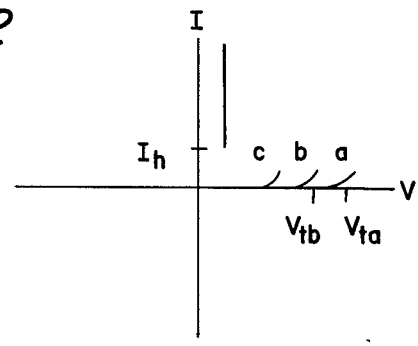
FIG. 3a depicts the V-I characteristics of the switch of FIG. 3.

As noted in U.S. Patent application Ser. No. 412,211, filed Nov. 2, 1973, (U.S. Pat. No. 3,906,537) the device 6 of FIG. 3 will exhibit heat responsive threshold switching if the layer 10 of amorphous semiconductor material extends beyond the domain defined by the contact area between electrode 11 and layer 10, that is, layer 10 extends slightly beyond electrode 11, as shown in FIG. 3. An extension of 10 micrometers is sufficient, as explained in the aforementioned copending patent application. More specifically, layer 10 can be a disk having a radius of 0.041 cm and electrode 11 can be a disk having a radius of 0.040 cm Referring to FIG. 3a, there is shown the V-I characteristic of each of the switches 6 for different ambient temperatures. As shown, all regions of the V-I curve of the switches 6 are not accessible and, in fact, the V-I characteristic of each switch 6 is comprised of regions of two types: a generally high resistance region from the origin to $V_t$ and then an abrupt transition to a low resistance branch of the curve which is not sustained below the current $I_n$. Curve "a" of FIG. 3a represents the V-I characteristic of a switch 6 at room temperature (300° K), with curves "b" and "c" representing the V-I characteristic at temperatures of 305° K and 310° K, respectively. From FIG. 3a it is seen that the threshold voltage require to switch a switch 6 to its low resistance state decreases as the temperature of the switch 6 increases in the vicinity of room temperature. It is noted particularly that once a heated switch 6 switches to its low resistant state it will remain in that state even if the switch is no longer heated, that is, even if the switch 6 is allowed to cool to ambient temperature, provided that it remains biased by a current greater than the holding current corresponding to the threshold voltage at which it switched to its low resistant state. For example, if a switch 6 having the physical parameters specified is heated by a heating resistor 8 to a temperature of 310° K (curve c of FIG. 3a), a clock voltage of 30 volts is sufficient both to switch the switch 6 to its low resistance state and to maintain it in that state when it is no longer heated. A clock voltage of 30 volts is insufficient to switch any of the switching 6 to their low resistance state when they are at ambient temperature.

Referring again to FIG. 1, the amplitudes of the $\phi_1$ and $\phi_2$ clock signals are chosen so that the voltage across all of the threshold switches 6 will be below the room temperature threshold voltage when none of the heating resistors 8 is carrying current. In this condition, all threshold switches 6 are in their high resistance state and negligible current flows through the heating resistors 8. Suppose at time $t_0$, when the $\phi_1$ signal is low and the $\phi_2$ signal is high, that current is passed through the heating resistor 8 of module 4'. This current flow will produce heating of switch 6 of module 4' and reduce its threshold voltage but not to a value equal to, or below, the voltage of the $\phi_1$ signal at that time. Suppose that the heating of switch 6 of module 4' by heating resistor 8 of module 4' continues until the $\phi_1$ signal voltage goes high, for example, to 30 volts. This $\phi_1$ signal voltage is sufficient to bias switch 6 of module 4' to its low resistant state wherein current will flow through switch 6 of module 4' and, due to the series connection between a switch 6 and a heating resistor 8 of the next succeeding module, through heating resistor 8 of module 4''. Once switch 6 of module 4' is in its low resistant state, the current flow through heating resistor 8 of module 4' can be stopped since there is sufficient voltage across switch 6 of module 4' to maintain it in its low resistance state in the absence of external heating. The current flowing through heating resistor 8 of module 4'' will cause the switch 6 of module 4' to heat up so that when the $\phi_2$ signal voltage goes high (and the $\phi_1$ signal voltage concurrent goes low) switch 6 of module 4'' will be biased to its low resistance state, thereby conducting current and allowing current to flow through heating resistor 8 of module 4''' with attendant heating of switch 6 of module 4'''. If the fall time of the $\phi_1$ signal is rapid, for example, 10 microseconds, switch 6 of module 4''' will not have been heated enough to switch to its low resistant state. When the $\phi_1$ signal voltage goes high again and the $\phi_2$ signal voltage goes low, switch 6 of module 4' will stay off due to its having cooled to about ambient temperature but now heated switch 6 of module 4''' will conduct and provide heating of switch 6 of module '''' by heating resistor 8 of module 4''''. In this manner, a single bit can be clocked through the shift register to module $4^n$. The periods of the $\phi_1$ and $\phi_2$ voltage pulses must be sufficient to allow a previously conducting switch to cool to about room temperature before a high voltage pulse is again applied thereto so that two switches are not simultaneously switched to their low resistance state. For example, the periods of the $\phi_1$ and $\phi_2$ signals can be on the order of 100 microseconds so that when, for example, the $\phi_1$ voltage goes high and switch 6 of module 4''' is being heated by heating resistor 8 of that module, that switch 6 of module 4' will have cooled to about room temperature. If, instead of a bit, an entire binary word is clocked into the input, this binary word would be loaded into the shift register and scanned along at a rate of 1 bit per clock cycle. By monitoring the state of switch 6 of module $4^n$, the shifted data can be read out and, if desired, may be recirculated to the input by line 18.

As noted, maximum clock rates will be governed by the thermal time constants of the system, but there is no minimum clock rate. If one clock is held high and the other low, the data in the register 2 will be stored indefinitely. Erasure can be performed by either shifting out the contents of the register 2 or by putting the voltage of both clock inputs low. Since the threshold switches 6 are unipolar, any polarity clock signals can be used, which may be beneficial in matrix addressing schemes.

Figure 4:
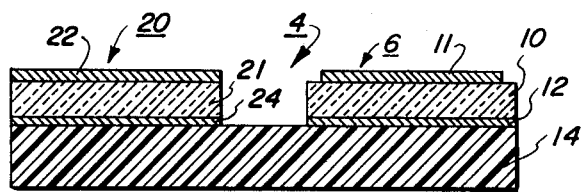
FIG. 4 illustrates a stage of the shift register of FIG. 1 in integrated circuit form.

The heating resistors 8 can be amorphous semiconductor current controlled negative differential resistance elements and a composite amorphous semiconductor module 4 of a current controlled negative differential resistance element and a threshold switch would be as shown in FIG. 4. As before, each switch 6 is comprised of amorphous semiconductor material layer 10 sandwiched between electrodes 11 and 12, with each current controlled negative differential resistance element 20 comprised of a layer of amorphous semiconductor material 21 (which can be one of the same material and thickness as layer 10 of switch 6) sandwiched between electrodes 22 and 24 (which can be of the same materials and thicknesses as electrodes 11 and 12 of switch 6). Element 20 is situated in close proximity to switch 6, a spacing of 10–25 microns being suggested, and may be ring shaped such as to surround switch 6. The amorphous semiconductor heater-threshold switch module embodiment of FIG. 4 has the advantage that both the heater and the threshold switch can be formed simultaneously on a common glass substrate by a series of conventional steps. The process is initiated by successive vapor deposition of, for example, a 0.25 micron layer of chromium, followed by deposition of a 1 micron layer of amorphous chalcogenide material, such as, for example, $a$-$As_2SeTe_2$, with subsequent vapor deposition of, for example, a 0.5 micron layer of aluminum. Using conventional photolithographic techniques, the aluminum layer is provided with a resist mask over the desired area of layer 10 and over the desired area of electrode 22 and the metallic and semiconductor materials between the masked regions is acid etched down to the glass substrate. Following further masking, a portion of electrode 11 is removed so that electrode 11 and layer 10 are not coextensive. Preferably a distance of 10–25 microns is provided between switch 6 and element 20. Aluminum leads are ultrasonically bonded to all of the electrodes. It is noted that electrode 22 is coextensive with layer 21 to provide a current controlled negative differential resistance characteristic, as explained in the aforementioned copending patent application.

Critical features of the integrated circuit layout are that the thermal coupling between the heating element 20 and the threshold switch of a module is strong, while the coupling between a heating element and a threshold switch of another module is weak. If a 10 micron spacing is used for the strong thermal link and the final devices are arranged on an array of 100 per inch, the thermal coupling distance to the wrong switch will be 10–25 times greater than that to the "correct" switch. This should result in a several order of magnitude difference in temperature rise between the selected threshold switch and its nearest neighbor.

Due to the nature of the V-I characteristic of the threshold switches 6, that is, they remain in their low resistance state in the absence of external heat if the threshold voltage is maintained, the shift register of FIG. 1 can be used in a multiplicity of systems.

I claim:

1. A shift register having a plurality of stages comprising:
    a threshold switching device in each stage, each of said devices being comprised of a body of semiconductor material sandwiched between a first electrode and a second electrode and each of said devices having a voltage-current characteristic with a generally high resistance region to a threshold voltage and an abrupt transition to a low resistance region,
    a heating element in each stage, each of said heating elements being in heat transfer proximity to only the threshold switching device of its stage,
    the threshold switches of all but the last of said plurality of stages being connected in series with the heating element of the next succeeding stage such that conduction of a threshold switch of one stage causes its series connected heating element to generate heat and to thereby heat the threshold switching device of the next succeeding stage, and
    means for supplying a voltage waveform of a first phase to the threshold switching devices of alternate of said stages, for supplying a voltage waveform of a phase opposite to that of said first phase to the threshold switching devices of said stages intermediate said alternate stages, and for maintaining a terminal of each of said heating elements at a reference potential, the amplitude of said voltage waveform varying between a high value and a low value with the high value being sufficient to switch only a heated threshold switch to its low resistance state and to maintain it in that state in the absence of further external heating whereby an initial triggering pulse is made to propagate through the shift register as the amplitude of the voltage waveforms change.

2. The shift register of claim 1 wherein each of said heating elements is comprised of a body of semiconductor material sandwich between a pair of electrodes with said heating elements having a voltage-current characteristic with a generally high resistance region to a threshold voltage, a negative resistance region, and a low resistance region.

3. The shift register of claim 2 wherein each of said pair of electrodes of said heating elements are coextensive with said body of semiconductor material, and wherein the semiconductor material of each of said threshold switching devices extends beyond one of the electrodes between which it is sandwiched.

4. The shift register of claim 3 wherein said bodies of semiconductor material of said heating elements and said threshold switches are of the same semiconductor material.

5. The shift register of claim 4 wherein said bodies of semiconductor material are a chalcogenide glass.

6. The shift register of claim 5 wherein said threshold switches and said heating elements are formed as an integrated circuit on a common substrate.

* * * * *